United States Patent [19]

Barker et al.

[11] Patent Number: 5,675,329
[45] Date of Patent: Oct. 7, 1997

[54] METHOD OF OBTAINING A SECOND FUNCTION FROM KEYS ON A KEYBOARD USING PRESSURE DIFFERENTIATION

[75] Inventors: John Howard Barker, Cumming, Ga.; Gennaro Battiloro, Boca Raton, Fla.; Gary Robert McClurg, Louisburg, N.C.; Guy Francis Verrier, Boca Raton, Fla.; Gary Edward Webb, Cumming, Ga.

[73] Assignee: International Business Machines Corporation, Armonk, N.Y.

[21] Appl. No.: 647,098

[22] Filed: May 9, 1996

[51] Int. Cl.⁶ .................................................. G06F 3/14
[52] U.S. Cl. .................................... 341/22; 364/189
[58] Field of Search .......................... 341/22, 20, 32, 341/33, 34; 364/189

[56] References Cited

U.S. PATENT DOCUMENTS

| | | | |
|---|---|---|---|
| 4,296,406 | 10/1981 | Pearson | 340/166 R |
| 4,313,113 | 1/1982 | Thornburg | 340/709 |
| 4,323,888 | 4/1982 | Cole | 340/365 A |
| 4,381,502 | 4/1983 | Prame | 340/365 R |
| 4,524,256 | 6/1985 | Miyata et al. | 200/86 R |
| 4,615,252 | 10/1986 | Yamauchi et al. | 84/1.1 |
| 4,649,784 | 3/1987 | Fulks et al. | 84/1.1 |
| 4,651,611 | 3/1987 | Deforeit | 84/1.1 |
| 4,794,366 | 12/1988 | Sakamoto | 338/114 |
| 4,933,807 | 6/1990 | Duncan | 361/283 |
| 5,025,705 | 6/1991 | Raskin | 84/743 |
| 5,053,585 | 10/1991 | Yaniger | 178/18 |
| 5,115,705 | 5/1992 | Monte et al. | 341/34 |
| 5,164,558 | 11/1992 | Huff et al. | 200/83 R |
| 5,184,120 | 2/1993 | Schultz | 341/23 |
| 5,184,319 | 2/1993 | Kramer | 364/806 |
| 5,231,380 | 7/1993 | Logan | 340/706 |
| 5,241,308 | 8/1993 | Young | 341/34 |
| 5,244,296 | 9/1993 | Jensen | 400/715 |
| 5,252,971 | 10/1993 | Franz et al. | 341/26 |
| 5,278,557 | 1/1994 | Stokes et al. | 341/34 |
| 5,281,958 | 1/1994 | Ashmun et al. | 345/157 |
| 5,287,089 | 2/1994 | Parsons | 345/156 |
| 5,305,238 | 4/1994 | Starr, III et al. | 364/569 |
| 5,308,917 | 5/1994 | Kitamura et al. | 84/607 |
| 5,309,172 | 5/1994 | Fox | 345/159 |
| 5,339,095 | 8/1994 | Redford | 345/158 |
| 5,341,133 | 8/1994 | Savoy et al. | 341/22 |
| 5,355,148 | 10/1994 | Anderson | 345/166 |
| 5,396,235 | 3/1995 | Maeshima et al. | 341/34 |
| 5,521,596 | 5/1996 | Selker et al. | 341/22 |
| 5,579,238 | 11/1996 | Krugman | 364/508 |

OTHER PUBLICATIONS

"Touch–Pressure Sensitive Frequency–Modulation Keyboard," *IBM Technical Disclosure Bulletin*, vol. 20, No. 10, Mar. 1978, pp. 4039–4040.

*Primary Examiner*—Jeffrey Hofsass
*Assistant Examiner*—Albert K. Wong
*Attorney, Agent, or Firm*—Richard A. Tomlin; George E. Clark; Raymond M. Galasso

[57] ABSTRACT

A method of obtaining a second function from keys on a standard QWERTY configured computer keyboard that have only a first function when struck individually is disclosed. First, the force applied by the user on the keyboard is measured and detected during a first period of time, and the normal level of force applied by the user is determined. Next, a second function actuating force which is greater than the normal force applied by the user is selected, and the force applied by the user on a keyboard during a second period of time is measured and detected. It is then determined whether the force applied by the user during the second period of time is greater than the second function actuating force, and if so, a computer operatively coupled to the keyboard is caused to perform a second function associated with the key. Otherwise, the computer performs the first function associated with the key.

11 Claims, 2 Drawing Sheets

METHOD OF OBTAINING A SECOND FUNCTION FROM KEYS ON A KEYBOARD USING PRESSURE DIFFERENTIATION

FIELD OF THE INVENTION

This invention relates generally to keyboards for inputting data and, more particularly, to computer keyboards. This invention further relates to methods of obtaining a second function from keys on a keyboard that have only a first function when struck individually.

BACKGROUND OF THE INVENTION

Computer keyboards are typically used to enter operator data by transforming operator depressions on an X-Y matrix of momentarily depressed key switches into data codes that are then inputted to the system unit of a computer. On a standard configured QWERTY data entry keyboard, the operator depresses the keys with several fingers. An operator experienced in touch typing will make use of all fingers on both hands. In addition to normal characters and numerals, the data entry keyboard presents the operator with several function modifier keys such as "shift," "control," and "alt." The standard QWERTY keyboard does not have a unique key for every desired data code. Typically the same key is used for several different data codes. The desired data code is selected by depressing an additional function key such as the shift, control, or alt key while depressing the target key also. For example, by holding the shift key down and depressing a target key, the operator selects the shifted key, this usually being a capitalized, upper case representation of the normally uncapitalized letter.

This method of multiplexing key usage was developed on the early mechanical typewriters wherein the shift key actually caused physical movement of the print head. This technology has been carried over to modern data entry keyboards. Current electronic data entry keyboards do not rely on mechanical elements to perform the shifting function; instead, the physical depression of the shift key is translated into an electrical signal that is used as the stimulus to modify the target key data code into the shifted representation. While the origins of the shift key usage is known, it may not be the most efficient method of implementing the shifted data code on electronic keyboards.

In U.S. Pat. No. 4,381,502 issued to Prame, an alternate method and apparatus for character generation is disclosed. However, the method and apparatus disclosed still requires the user to depress at least two keys to obtain a second function from keys on a keyboard that only have a first function when struck individually.

U.S. Pat. No. 5,396,235 issued to Maeshima et al. discloses a numeral setting apparatus for setting numerals such as copy magnification, copy density, or the like. The numeral setting apparatus includes keys for changing the numerals based on a magnitude of force which is applied to the keys. When a larger force is applied to the keys, the setting device changes the numerals in larger increments than those in the case where less force is applied. The '235 patent does not disclose a method of obtaining a second function from a key wherein the first and second functions are not be related in terms of magnitude. Also, the '235 patent does not disclose a method of obtaining a second function from keys on a QWERTY configured computer keyboard that have only a first function when struck individually.

SUMMARY OF THE INVENTION

The present invention is directed to a method of obtaining a second function from keys on a keyboard that have only a first function when struck individually. The method comprises: detecting the force applied by the user on the keyboard during a first period of time, determining from the detecting step a normal level of force applied by the user, selecting a second function actuating force which is greater than the normal force applied by the user by a predetermined Amount, detecting the force applied by the user on the keyboard during a second period of time, determining if the force applied by the user during the second period of time is greater than the second function actuating force, and causing a machine associated with the keyboard to perform the first function when a key is struck with force which is less than the second function actuating force and to perform the second function when a key is struck with force which is greater than the second function actuating force.

One advantage of the present invention is that it provides a user the ability to control two functions with a single key entry. Another advantage of the present invention is that it reduces the total number of keys needed on a keyboard to perform the functions needed.

DETAILED DESCRIPTION OF A PREFERRED EMBODIMENT OF THE INVENTION

Generally, the present invention provides a system for monitoring keyboard pressure/force and a method for using the monitored keyboard pressure to obtain a second function from keys on a keyboard that have only a first function when struck individually. The present invention allows a user to cause a machine associated with a keyboard, such as a computer, to perform dual functions from a single key on the keyboard.

Figure 1:
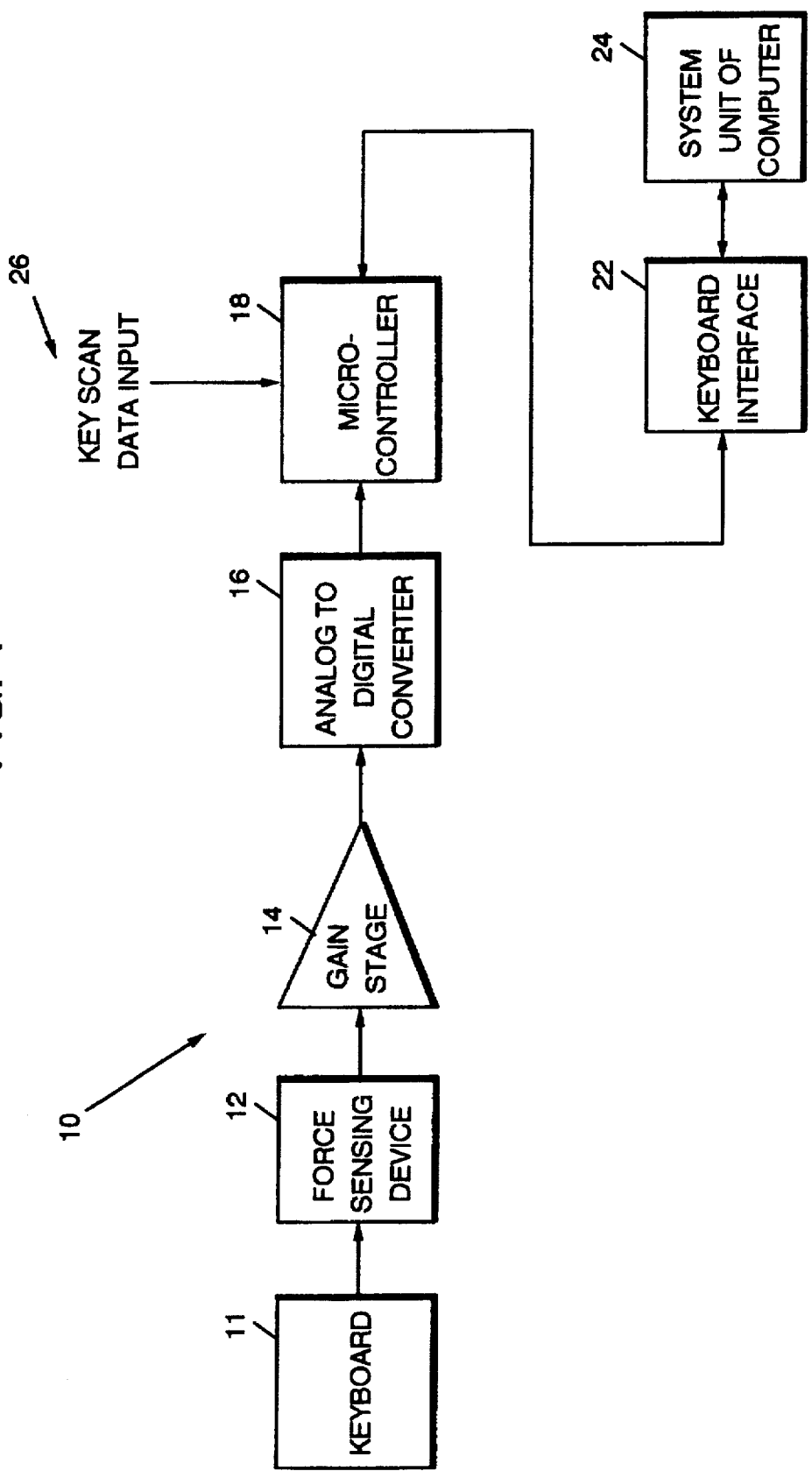
FIG. 1 illustrates a schematic block diagram of a keyboard force monitoring system used to implement the method of the present invention.

FIG. 1 illustrates a keyboard force monitoring system which may be used to implement the method of the present invention. System 10 includes a keyboard 11, a force sensing device 12, a gain stage 14, an analog-to-digital converter (ADC) 16, a microcontroller 18, a keyboard interface 22, and a system unit 24 of a computer. Keyboard 11 may be any data input device which requires a user to press a key or button to input data to a computer or other data processing equipment. Preferably, keyboard 11 is a computer keyboard having an X-Y matrix of momentarily depressed key switches having a conventional QWERTY configuration. Force sensing device 12 senses the pressure/force exerted on a keyboard 11 key and/or the entire keyboard 11 and converts the pressure into an analog voltage. Force sensing device 12 may be employed using piezo and foil strain gauges, optical, magnetic and capacitive technologies. In the preferred embodiment, force sensing device 12 comprises a force sensing resistor, wherein the resistance of the force sensing resistor changes as a function of pressure load placed on it, and a power supply coupled to the force sensing resistor.

Gain stage 14 amplifies the analog signal received from force sensing device 12. ADC 16 converts the amplified analog signal received from the output of the gain stage 14 and converts it into a digital signal representing the pressure. Microcontroller 18 receives the digital signal from ADC 16 and compares the digital representation of the pressure to a threshold value stored within the microcontroller 18. The threshold value is a predefined value representing a second function actuating force which is greater than the normal force exerted by a user on a keyboard 11 key or the entire keyboard 11 by some predetermined amount. If the pressure is greater than the stored threshold, microcontroller 18 produces a control signal prompting the microcontroller 18 to retrieve a key scan data byte corresponding to a second function associated with the key and then sends, in a manner to be described below, the key scan data byte to the system unit 24 of a computer such that the computer is instructed to perform the second function. If the pressure is less than the stored threshold, microcontroller 18 produces a second control signal prompting the microcontroller 18 to retrieve a key scan data byte corresponding to a first function associated with the key and then sends, in a manner to be described below, the key scan data byte to the system unit 24 of a computer such that the computer is instructed to perform the first function.

Microcontroller 18 is coupled to keyboard interface 22. Keyboard interface 22 couples microcontroller 18 to system unit 24 of a computer for transmittal of data to/from microcontroller 18 to/from system unit 24. In this manner, key scan data bytes corresponding to either the first function or the second function of a key can be transmitted to the system unit 24 of a computer so that the computer performs either the first function or the second function. Also, a user may adjust the threshold value for the second function actuating force stored within microcontroller 18 via the communication link between system unit 24 and microcontroller 18.

Microcontroller 18 receives a key scan data input signal 26 for prompting the microcontroller 18 to send a key scan data byte to system unit 24 based upon the force exerted upon a keyboard 11 key or on the entire keyboard 11. In this manner, system 10 may be used to cause a computer operably coupled to keyboard 11 to perform multiple functions based on the force exerted on a keyboard 11 key or on the entire keyboard 11. One or more force sensing devices 12 may be employed to measure force being applied to one or more keys of the keyboard 11 or the entire keyboard 11.

Force sensing device 12, gain stage 14, ADC 16, microcontroller 18, and keyboard interface 22 may be housed within the keyboard 11. System 10 is non-intrusive to the normal operation of keyboard 11, i.e., all keys may be used in their traditional implementation. For example, the shift key may be used to change a target key to its shifted state. Also, a user may disable or turn off the pressure monitoring feature and/or the pressure-activated key feature of keyboard 11.

Figure 2:
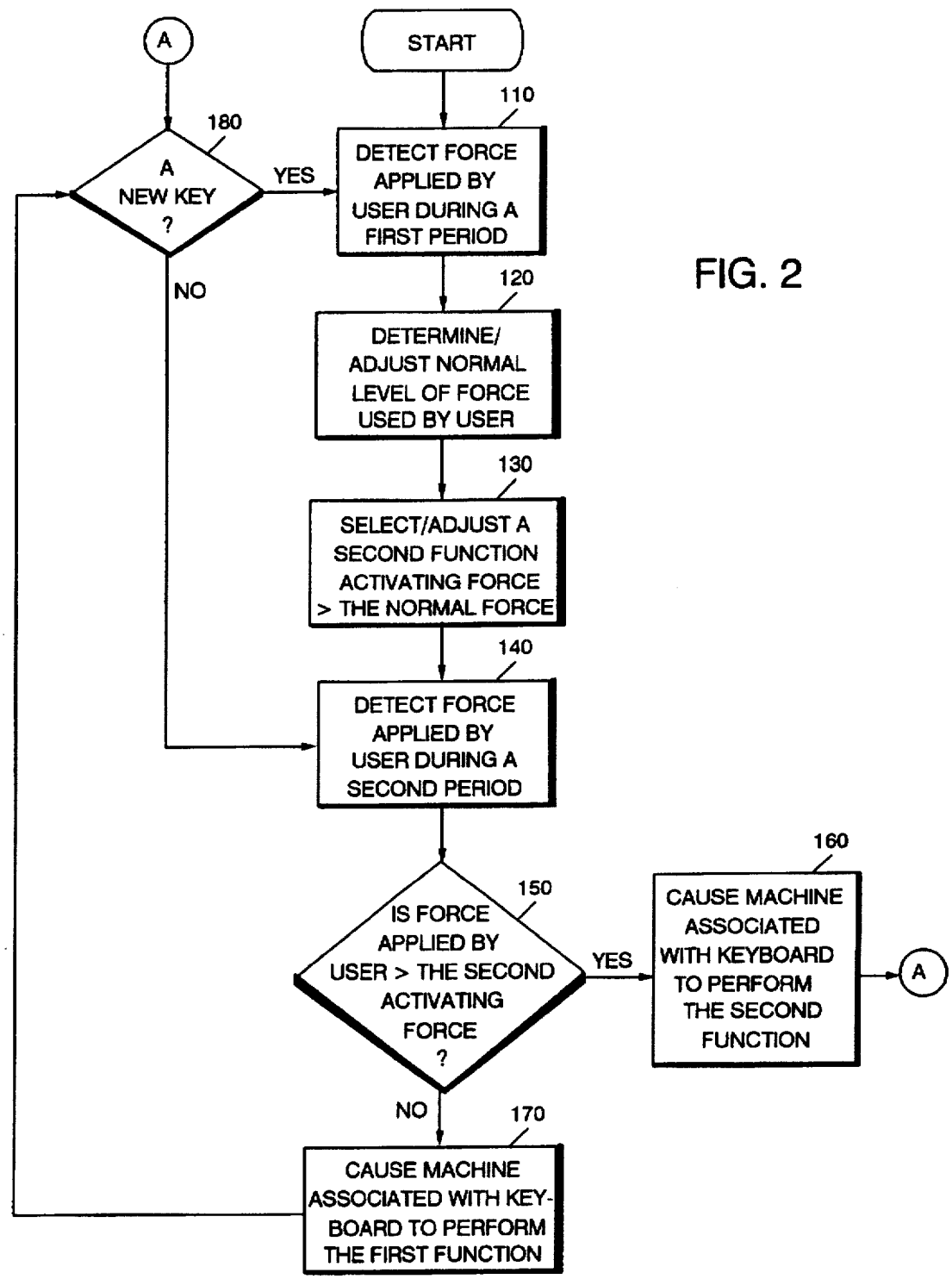
FIG. 2 illustrates a logic diagram illustrating a method of obtaining a second function from keys on a keyboard that have only a first function when struck individually in accordance with the present invention.

FIG. 2 illustrates a method which utilizes the previously described system 10 to obtain a second function from keys on a standard configured QWERTY keyboard that have only a first function when struck individually. At step 110, the process detects or measures the force applied by the user on the keyboard 11 during a first period of time. The process then proceeds to step 120 where the normal level of force applied by the user is determined from the measured force value detected in step 110. The process then proceeds to step 130 where a second function actuating force greater than the normal force by some predetermined amount is selected. Next, the process proceeds to step 140 where the force applied by the user during the second period of time is detected and measured. The process then proceeds to step 150 where it is determined whether the force applied by the user during the second period of time is greater than the second function actuating force. If the force applied by the user during the second period of time is greater than the second function actuating force, then the process proceeds to step 160 where a machine associated with the keyboard 11, such as a computer, is caused to perform the second function associated with a key on keyboard 11.

If the force applied by the user during the second period of time is not greater than the second function actuating force, then the process proceeds to step 170 where a machine associated with the keyboard 11 is caused to perform the first function associated with the key. After step 160 or step 170 is complete, the process proceeds to step 180.

In step 180, it is determined whether a new key has been pressed by a user. If a new key has been pressed by the user, then the process returns to step 110 to repeat the process of determining a normal level of force for the new key and selecting a second function actuating force greater than the normal force. If a new key has not been pressed, i.e., a key that has already been pressed has been pressed again, the process returns to step 140 to repeat the process of determining whether a force greater than the second actuating force has been applied. In this manner, steps 110, 120, 130, 140, and 150 and 160 or 170 may be repeated for each key of the keyboard 11.

Step 120 may additionally comprise the step of using the data gathered from each of the keys to arrive at an avenge normal level force for the keyboard 11, i.e., the sum of the normal level of force for each key divided by the total number of keys on the keyboard 11. Step 160 may additionally comprise the step of causing a machine associated with the keyboard to type a lower case letter, perform a TAB function, perform an F1–F12 function, perform a control function, or perform an alt function, when a letter key, a tab key, an F1–F12 key, a CTRL key, or an ALT key, respectively, is struck with force which is less than the second function actuating force and to type an upper case letter, perform a BACK-TAB function, perform a shifted F1–F12 function, perform a shifted control function, or perform a shifted alt function when a letter key, the tab key, an F1–F12 key, the CTRL key, or the ALT key, respectively, is struck with force which is greater than the second function actuating force. It is to be understood that the TAB, BACK-TAB, F1–F12, shifted F1–F12, control, shifted control, alt and shifted alt functions as used in the present invention retain their conventional and well-known meanings.

Step 120 may further comprise the step of adjusting the normal level of force applied by the user, and step 130 may further comprise the step of adjusting the second function actuating force. In this manner, the normal level of force and the second function actuating force may be adjusted for a new user or to increase or decrease sensitivity.

Step 120 may further comprise the steps of detecting the force applied by the user on a key of the keyboard during a first period of time, detecting the force applied by the user on the key during a second period of time, subtracting the force applied by the user on the key during the first period of time from the force applied by the user on the key during the second period of time to determine a key force threshold delta, adding the key force threshold delta to the force applied by the user on the keyboard during the first period of time to determine the normal level of force applied by the user to the key and repeating steps a) through d) for each key on the keyboard.

Although the present invention and its advantages have been described in detail, it should be understood that various changes, substitutions and alterations can be made herein without departing from the spirit and scope of the invention as defined by the appended claims.

What is claimed is:

1. A method of obtaining a second function from keys on a keyboard that have momentarily depressed switches for invoking only a first function when struck individually, said method comprising the steps of:

coupling a force sensing device to the momentarily depressed switches of the keyboard;

detecting, by the force sensing device, the force applied by the user on the keyboard during a first period of time;

determining from said detecting step a normal level of force applied by the user;

selecting a second function actuating force which is greater than the normal force applied by the user by a predetermined mount;

detecting, by the force sensing device, the force applied by the user on the keyboard during a second period of time;

determining if the force applied by the user during said second period is greater than the second function actuating force;

causing a machine associated with said keyboard to perform said first function when a key is struck with force which is less than said second function actuating force and perform said second function when a key is struck with force which is greater than said second function actuating force.

2. A method as recited in claim 1, wherein said step of detecting the force applied by the user on the keyboard during a first period of time comprises the step of detecting the force applied by the user on each key of the keyboard used during said first period of time.

3. A method as recited in claim 2, wherein said step of determining a normal level of force applied by the user uses the data gathered from each of the keys to arrive at an average normal level of force for the keyboard.

4. A method of obtaining a second function from keys on a keyboard that have momentarily depressed switches for invoking only a first function when struck individually, said method comprising the steps of:

a) coupling a force sensing device to a momentarily depressed switch operably associated with a key on the keyboard;

b) detecting, by the force sensing device, the force applied by the user on the key of the keyboard during a first period of time;

c) detecting, by the force sensing device, the force applied by the user on the key during a second period of time;

d) subtracting the force applied by the user on the key during the first period of time from the force applied by the user on the key during the second period of time to determine a key force threshold delta;

e) adding the key force threshold delta to the force applied by the user on the key during the first period of time to determine a normal level of force applied by the user to the key;

f) selecting a second function actuating force which is greater than the normal force applied by the user by a predetermined mount for the key;

g) determining if the force applied by the user during a third period of time is greater than the second function actuating force;

h) musing a machine associated with said keyboard to perform said first function when the key is struck with force which is less than said second function actuating force and perform said second function when the key is struck with force which is greater than said second function actuating force; and i) repeating steps a) through h) for each key on the keyboard.

5. A method as recited in claim 4, wherein said causing step comprises causing a machine associated with said keyboard to type a lower case letter when a letter key is struck with force which is less than said second function actuating force and to type an upper case letter when a letter key is struck with force which is greater than said second function actuating force.

6. A method as recited in claim 4, wherein said causing step comprises causing a machine associated with said keyboard to perform a TAB function when a tab key is struck with force which is less than said second function actuating force and to perform a BACK-TAB function when the tab key is struck with force which is greater than said second function actuating force.

7. A method as recited in claim 4, wherein said causing step comprises causing a machine associated with said keyboard to perform an F1–F12 function when an F1–F12 key, respectively, is struck with force which is less than said second function actuating force and to perform a shifted F1–F12 function when an F1–F12 key, respectively, is struck with force which is greater than said second function actuating force.

8. A method as recited in claim 4, wherein said causing step comprises causing a machine associated with said keyboard to perform a control function when a CTRL key is struck with force which is less than said second function actuating force and to perform a shifted control function when the CTRL key is struck with force which is greater than said second function actuating force.

9. A method as recited in claim 4, wherein said causing step comprises causing a machine associated with said keyboard to perform an alt function when an ALT key is struck with force which is less than said second function actuating force and to perform a shifted ALT function when the ALT key is struck with force which is greater than said second function actuating force.

10. A method as recited in claim 1, wherein said selecting a second function actuating force step further comprises the step of adjusting the second function actuating force.

11. A method as recited in claim 1, wherein said determining from said detecting step a normal level of force step comprises the step of adjusting the normal level of force.

* * * * *

UNITED STATES PATENT AND TRADEMARK OFFICE
CERTIFICATE OF CORRECTION

PATENT NO. :  5,675,329
DATED      :  October 7, 1997
INVENTOR(S) : BARKER, ET AL.

It is certified that error appears in the above-indentified patent and that said Letters Patent is hereby corrected as shown below:

Column 5, line 15          Delete "mount"
                               Replace with "amount"

Column 6, line 3           Delete "mount"
                               Replace with "amount"

Column 6, line 7           Delete "musing"
                               Replace with "causing"

Signed and Sealed this

Sixth Day of January, 1998

Attest:

BRUCE LEHMAN

Attesting Officer        Commissioner of Patents and Trademarks